United States Patent [19]
Fukushi et al.

[11] Patent Number: 4,860,366
[45] Date of Patent: Aug. 22, 1989

[54] TELECONFERENCE SYSTEM USING EXPANDERS FOR EMPHASIZING A DESIRED SIGNAL WITH RESPECT TO UNDESIRED SIGNALS

[75] Inventors: Yuzo Fukushi; Hitoshi Fuda; Taisuke Sasada, all of Tokyo, Japan

[73] Assignee: NEC Corporation, Tokyo, Japan

[21] Appl. No.: 79,971

[22] Filed: Jul. 31, 1987

[30] Foreign Application Priority Data

Jul. 31, 1986 [JP] Japan ................................ 61-181328
Jul. 31, 1986 [JP] Japan ................................ 61-181332

[51] Int. Cl.$^4$ ............................................ H03G 7/00
[52] U.S. Cl. .................................... 381/106; 379/206; 381/94
[58] Field of Search .................. 379/206; 381/106, 92, 381/94; 333/14

[56] References Cited

U.S. PATENT DOCUMENTS 3,026,374  3/1962  Hilliard et al. ...................... 379/206
4,008,376  2/1977  Flanagan et al. .................... 379/206

Primary Examiner—Forester W. Isen
Attorney, Agent, or Firm—Sughrue, Mion, Zinn, Macpeak & Seas

[57] ABSTRACT

A teleconference system comprises a plurality of microphones and a plurality of expanders connected respectively thereto for expanding the outputs of the microphones. A summing ammplifier produces a sum of the output signals of the expanders and feeds a compressor to compress the sum for transmission to a distant conference location. A desired signal from a given microphone has a higher level than undesired signals which may be detected by adjacent microphones, so it is emphasized by the associated expander with respect to the undesired signals. The compressor provides compression of the high- and low-level components of the sum in equal proportions so that the former is converted to a replica of the desired signal and the latter is suppressed to acceptable levels.

8 Claims, 2 Drawing Sheets

TELECONFERENCE SYSTEM USING EXPANDERS FOR EMPHASIZING A DESIRED SIGNAL WITH RESPECT TO UNDESIRED SIGNALS

BACKGROUND OF THE INVENTION

The present invention relates to a teleconference system.

In a prior art teleconference system, a plurality of microphones are located in each of spaced apart locations and participants are seated in front of the respective microphones. The outputs of the microphones are fed to a mixing circuit and transmitted to the other location for reproducing sounds through a loudspeaker. However, the sound generated by a participant is detected not only by the associated microphone but by adjacent ones at different times. The result is a reproduction of undesirable sounds which degrade the quality of the desired signal.

In a further prior art teleconference system as disclosed in U.S. Pat. No. 4,139,731 issued to Hassemi et al, a plurality of teleconference stations are connected to a conference bridge through voice-actuated switches. However, the voice-actuated switches tends to truncate the leading and trailing edges of a sound due to inherent time delays.

SUMMARY OF THE INVENTION

It is therefore an object of the present invention is provide a teleconference system having teleconference signals of improved quality.

This object is attained by emphasizing a desired signal with respect to undesired multiple signals using a plurality of expanders, combining the desired and undesired signals to produce a sum and deemphasizing the sum with a compressor to produce a replica of the desired signal, whereby the undesired signals are suppressed to a satisfactory level.

According to a first aspect of the present invention, there is provided a teleconference system comprising a plurality of microphones and a plurality of expanders connected respectively thereto for expanding the outputs of the microphones. A summing amplifier produces a sum of the output signals of the expanders and feeds a compressor to compress the sum for transmission to a distant conference location. A desired signal from one of the microphones has a higher level than undesired signals which may be detected by adjacent microphones, so it is emphasized by the associated expander with respect to the undesired signals. The individual components of the sum are equally comprised by the compressor, so the higher-level component is converted to a replica of the desired signal and the lower-level components are suppressed to a satisfactory level.

According to a second aspect of the invention, there is provided a teleconference system comprising a plurality of conference stations each having input and output terminals, a plurality of expanders having input terminals connected respectively to the output terminals of the conference stations, and a plurality of compressors having output terminals connected respectively to the input terminals of the conference stations. A conference bridge includes a plurality of conference ports each having an input terminal for receiving signals from the expanders and an output terminal for transmitting signals to the compressors. The conference bridge further includes means that combines signals received at the input terminal of any of the ports and couples the combined signals to the output terminals of all the conference ports except the port where the signal is received. The expanders emphasize a higher level signal from an active conference station with respect to lower level signals (noise) from inactive conference stations. The high and low level signals are combined in the conference bridge and fed to all the compressors except the compressor associated with the conference station from which the high level signal is received. Each compressor equally compresses the individual components of its input signal so that the high-level component is converted to a replica of the original and the lower-level components are converted to signals having satisfactory lower levels. The prior art disadvantage of speech truncation can therefore be avoided.

BRIEF DESCRIPTION OF THE DRAWINGS

The present invention will be described in further detail with reference to the accompanying drawings, in which.

DETAILED DESCRIPTION

Figure 1:
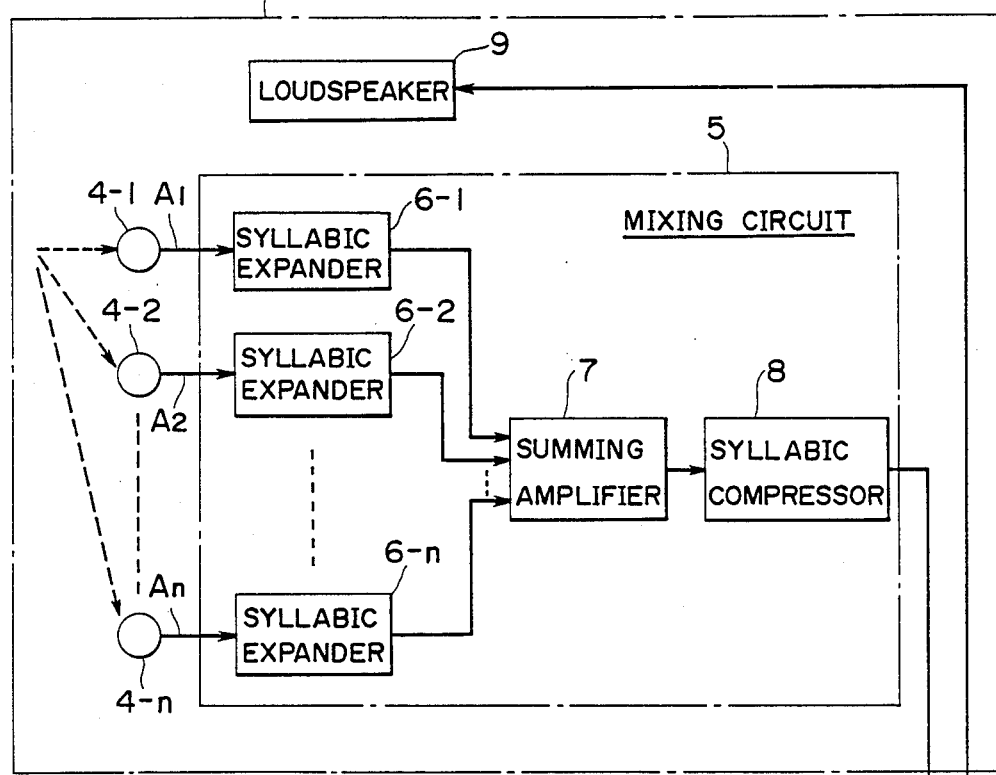
FIG. 1 is a block diagram of a first embodiment of the present invention.
Figure 1:
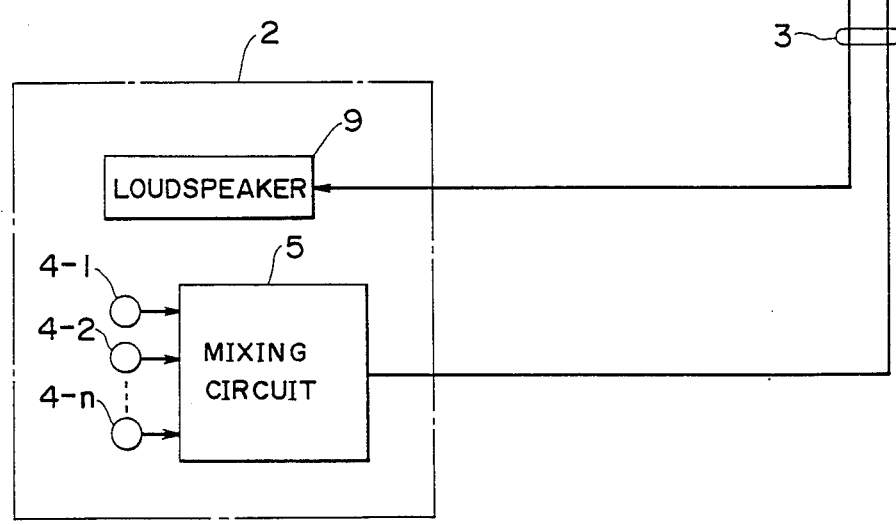

Referring to FIG. 1, there is shown a telephone conference system according to a first embodiment of the invention. The system comprises a first location 1 and a second location 2 connected by transmission lines 3, each location having an identical teleconference circuit. Each of the teleconference circuits comprises a plurality of conference stations, or microphones 4-1 through 4-n connected to a mixing circuit 5. Mixing circuit 5 includes a plurality of syllabic expanders 6-1 through 6-n, respectively associated with the microphones 4-1 through 4-n. The outputs of syllabic expanders 6-1 through 6-n are summed by a summing amplifier 7. The sum output of amplifier 7 is applied to a syllabic compressor 8, whose output is coupled to a loudspeaker 9 in the other location.

Figure 2:
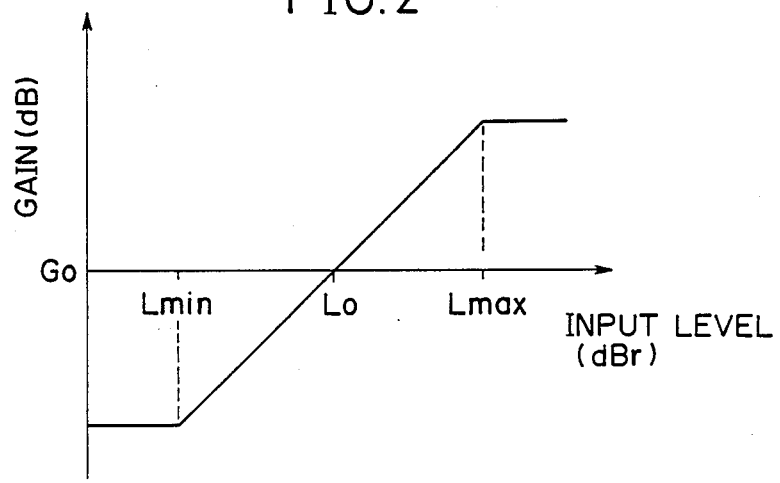
FIG. 2 is a graphic illustrating the gain of each syllabic expander of FIG. 1 plotted as a function of average input level.

Syllabic expanders 6-1 through 6-n integrate their respective input signals to detect their short-term average values, or envelopes and control their amplification gains as a function of the detected envelope in order to emphasize the highest of the input signals with respect to any other signals. In other words, the ratio of two input signals applied to adjacent microphones is multiplied by the expansion ratio of the expanders associated with such adjacent microphones. FIG. 2 illustrates the gain of each syllabic expander plotted as a function of the detected input level expressed in dBr. As illustrated, the gain of each expander varies proportionally as a function of the envelope of the input signal in the range between minimum and maximum values Lmin and Lmax, with Lo being a midpoint value of the range corresponding to a gain Go. If an expander has a gain Go+1 (dB) for an envelope Lo+1 (dBr), it is said to have an expansion ratio 2, and the ratio of two input signals passing through any adjacent expanders is multiplied by a factor 2. Syllabic compressor 8 detects the envelope of its output and controls its amplification gain so that it compresses the sum signal with a characteristic which is complementary to the expansion characteristic of each syllabic expander. Suitable circuitry for the expander and compressor is found in U.S. Pat. No. 4,253,072, entitled "Compandor with sampling and equalization", issued to C. B. Fisher et al.

In operation, the utterance of sound from a participant of a telephone conference seated in front of the microphone 4-1 is received by microphones 4-1 through 4-n so that microphones 4-1 generates a strongest voice signal A1 and microphones 4-2 through 4-n generate undesired weaker voice signals A2 to An. Since each expander has an expansion ratio 2, the ratio A1/A2 of signals A1 to A2 is expanded with the expansion ratio 2. Likewise, the amplitude ratio A1/An is expanded with the same ratio. The voice signals from expanders 6-1 through 6-n are summed and linearly amplified, thereby producing an output signal which is proportional to the number of expanders 6 that are active at any given time. Compressor 8 amplifies the summed signal with a variable gain inversely as a function of the envelope of the its output. Therefore, the individual components of the summed signal are compressed equally with the ratio 2, while maintaining the expanded amplitude ratios of the individual components. By arranging the microphones 4-1 through 4-n at appropriate locations, the desired signal A1 can be emphasized and the undesired components A2 through An can be suppressed satisfactorily in the other conference location.

Figure 3:
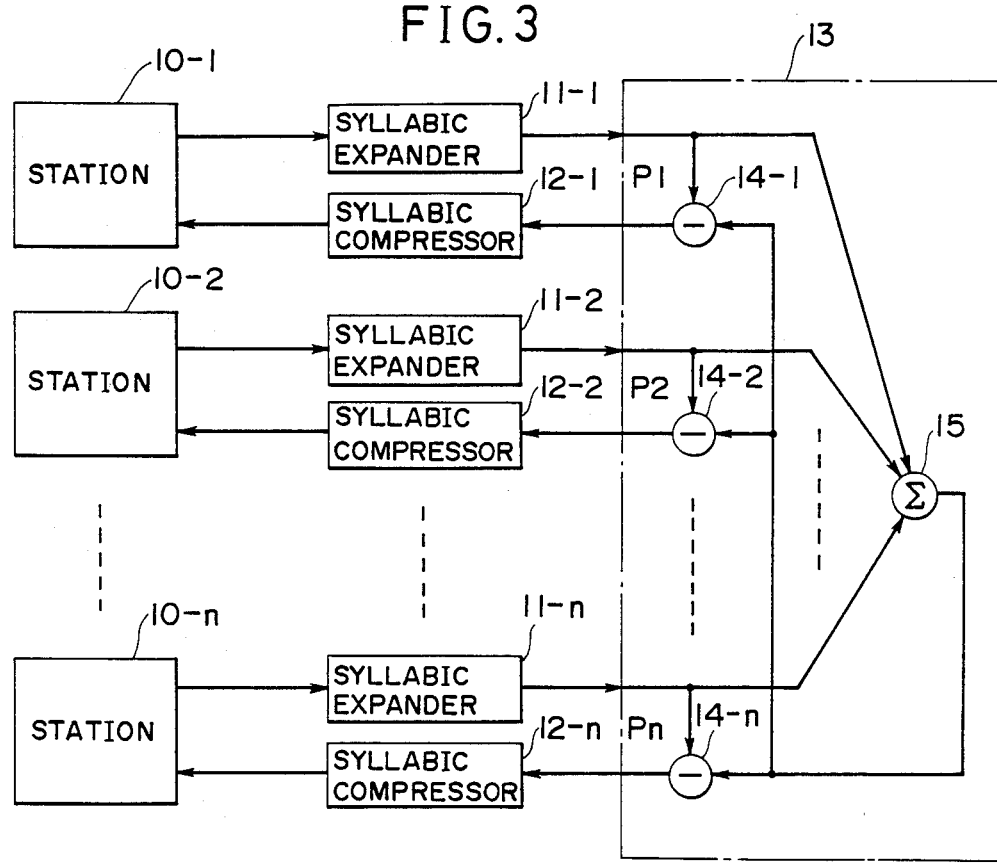
FIG. 3 is a block diagram of a second embodiment of the present invention.

A second embodiment shown in FIG. 3 is suitable for a teleconferencing system in which multiple conference stations 10-1 through 10-n are located respectively in different offices or premises. Outgoing signals from stations 10-1 through 10-n are respectively applied to associated syllabic expanders 11-1 through 11-n of identical construction and incoming signal to stations 10-1 through 10-n are respectively supplied from associated syllabic compressors 12-1 through 12-n of identical construction.

A conference bridge 13 has a plurality of four-terminal conference ports P1, P2 . . . Pn associated respectively with conference stations 10-1, 10-2 . . . 10-n and hence with expanders 11-1, 11-2 . . . 11-n and compressors 12-1, 12-2 . . . 12-n. Each conference port has an input terminal through which the output signal of the associated expander is applied to a summing amplifier 15 and an output terminal through which it applies signals to the input terminal of the associated compressor. Summing amplifier 15 produces an output signal proportional to the number of expanders 11 that are active at any given time. Subtractors 14-1 through 14-n are associated with conference stations 10-1 through 10-n respectively to differentially receive signals from the outputs of associated syllabic expanders 11-1 through 11-n and the output of summing amplifier 15 and supply differential outputs respectively to associated syllabic compressors 12-1 through 12-n. The outputs of syllabic compressors 12-1 through 12-n are applied to the conference stations 10-1 through 10-n, respectively.

Each of the syllabic expanders 11-1 through 11-n has the same expansion characteristics as those of the FIG. 1 embodiment, and each of the syllabic compressors 12-1 through 12-n has a compression characteristic complementary to the expansion characteristic of each of the expanders 11-1 through 11-n. The purpose of each subtractor 14 is to cancel from the output of the summing amplifier 15 the output of the associated expander 11. Therefore, conference bridge 13 couples signals received at the input terminals of any of its conference ports to the output terminals of all the conference ports except the port where the signal is received.

In operation, the conference stations 10-1 through 10-n are adjusted so that the short-term average values of their output values are equal to each other for a given voice signal applied to each conference station. Expanders 11 emphasize a voice signal from any active stations with respect to noise which may be detected by any other inactive stations by a factor determined by their expansion ratio. Therefore, the emphasized voice signal from any conference station is summed with noise from other stations that are inactive and compressed equally with the noise component by those compressors 12 associated with the inactive stations producing at the input terminals of the inactive stations, a replica of the original voice signal with the noise components being suppressed to a minimum. Thus, the teleconference system of FIG. 3 eliminates the partial loss of signal at the leading and trailing edges which would occurs as a result of the use of voice switches in the transmission lines between conference stations and the conferennce bridge in a manner as disclosed in the aforesaid U.S. Pat. No. 4,139,731.

What is claimed is:

1. A teleconference system comprising in a first conference room:
   a plurality of microphones for collecting speech energies from various sources in said first conference room so that the utterance of sound to one of said microphones produces a highest level output signal therefrom and lower level output signals from the other microphones;
   a plurality of expanders connected respectively to said microphones, each of said expanders amplifying a higher level signal with a higher gain than it amplifies a lower level signal so that a first ratio between the highest level output signal from one of said expanders and an output signal from each of the other expanders is greater than a second corresponding ratio between said highest level output signal from said one of said microphones and each of said lower level output signals from said other microphones;
   a summing amplifier for summing output signals from said expanders;
   a compressor for amplifying an output signal from said summing amplifier with a variable gain inversely as a function of the level of an output signal from said compressor so that the levels of said output signals of said expanders are respectively compressed with an equal ratio, and transmitting said output signal of said compressor through a channel to a second conference room; and
   a loudspeaker for receiving a signal transmitted from said second conference room.

2. A teleconference system as claimed in claim 1, wherein each of said expanders has a variable gain as a function of the envelope of a signal from the respective microphone, and wherein said compressor has a characteristic complementary to the characteristic of each of said expanders.

3. A teleconference system as claimed in claim 1, wherein the levels of said output signals of said expanders are respectively compressed with a ratio equal to said first ratio.

4. A teleconference system as claimed in claim 1, further comprising in said second conference room:

a second loudspeaker for receiving said output signal from said compressor through said channel;

a plurality of second microphones for collecting speech energies from various sources in said second conference room so that the utterance of sound to one of said microphones produces a highest level output signal therefrom and lower level output signals from the others of said second microphones;

a plurality of expanders connected respectively to said second microphones, each of said second expanders amplifying a higher level signal with a higher gain that it amplifies a lower level signal so that a third ratio between the highest level output signal from one of said second expanders and an output signal from each of the other second expanders is greater than a fourth, corresponding ratio between said highest level output signal from said one of said second microphones and each of said lower level output signals from said other second microphones;

a second summing amplifier for summing output signals from said second expanders; and a second compressor for amplifying an output signal from said second summing amplifier with a variable gain inversely as a function of the level of an output signal from said second compressor so that the levels of said output signals of said second expanders are respectively compressed with an equal ratio, and transmitting said output signal of said second compressor through a channel to said first conference room.

5. A teleconference system as claimed in claim 4, wherein each of the first-mentioned expanders and each of said second expanders have a variable gain as a function of the envelope of a signal from the respectively connected microphone, and wherein the first-mentioned compressors and said second compressors have characteristics which are complementary to the characteristics of said first and second expanders, respectively.

6. A teleconference system as claimed in claim 4, wherein the levels of said output signals of said second expanders are respectively compressed with a ratio equal to said third ratio.

7. A teleconference system as claimed in claim 1, wherein a plurality of said compressors and a like plurality of said loudspeakers are provided in respective association with said expanders, said plural loudspeakers being respectively connected to the outputs of said plural compressors, and wherein said summing amplifier further comprises a conference bridge which comprises a plurality of conference ports each having an input terminal for receiving signals from said expanders and an output terminal for transmitting signals to said compressors, and means for combining signals received at the input terminal of any of said ports and coupling the combined signals to the output terminals of all the conference ports except the port where the signal is received, wherein each of said microphones and each of said loudspeakers from a conference station.

8. A teleconference system as claimed in claim 7, wherein each of said expanders has a variable gain as a function of the envelope of a signal from the respectively connected microphones, and wherein each of said compressors has a characteristic complementary to the characteristic of each of said expanders.

* * * * *